United States Patent
Bruekers et al.

(10) Patent No.: US 6,650,255 B2
(45) Date of Patent: Nov. 18, 2003

(54) EFFICIENT CODING OF SIDE INFORMATION IN A LOSSLESS ENCODER

(75) Inventors: Alphons A. M. L. Bruekers, Eindhoven (NL); Adriaan J. Rijnberg, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/037,657

(22) Filed: Jan. 3, 2002

(65) Prior Publication Data

US 2002/0140586 A1 Oct. 3, 2002

Related U.S. Application Data

(63) Continuation of application No. 09/479,641, filed on Jan. 7, 2000, now Pat. No. 6,348,879.

(30) Foreign Application Priority Data

Jan. 7, 1999 (EP) .............................. 99200013
Jul. 16, 1999 (EP) .............................. 99202352

(51) Int. Cl.[7] .............................. H03M 7/00
(52) U.S. Cl. .......................... 341/50; 341/106; 341/107
(58) Field of Search .......................... 341/50, 51, 106, 341/107, 65, 143, 67, 59; 375/122

(56) References Cited

U.S. PATENT DOCUMENTS

| 5,214,678 | A | * | 5/1993 | Rault et al. .................. 375/240 |
| 5,581,653 | A |   | 12/1996 | Todd .......................... 395/2.38 |
| 6,121,904 | A | * | 9/2000 | Levine ........................ 341/65 |
| 6,144,320 | A | * | 11/2000 | Van Der Vleuten .......... 341/50 |
| 6,348,879 | B1 | * | 2/2002 | Bruekers et al. ............. 341/50 |

* cited by examiner

Primary Examiner—Brian Young
Assistant Examiner—John Nguyen

(57) ABSTRACT

For "Super Audio CD" (SACD) the DSD signals are losslessly coded, using framing, prediction and entropy coding. Besides the efficiently encoded signals, a large number of parameters, i.e. the side-information, has to be stored on the SACD too. The smaller the storage capacity that is required for the side-information, the better the overall coding gain is. Therefore coding techniques are applied to the side-information too so as to compress the amount of data of the side information.

12 Claims, 3 Drawing Sheets

EFFICIENT CODING OF SIDE INFORMATION IN A LOSSLESS ENCODER

This is a continuation of application Ser. No. 09/479,641, filed Jan. 7, 2000, now U.S. Pat. No. 6,348,879.

The invention relates to an apparatus for lossless encoding of a digital information signal, for a lossless encoding method, to an apparatus for decoding and to a record carrier.

For "Super Audio CD" (SACD) the DSD signals are losslessly coded, using framing, prediction and entropy coding. Besides the efficiently encoded signals, a large number of parameters, i.e. the side-information, has to be stored on the SACD too. The smaller the storage capacity that is required for the side-information, the better the overall coding gain is. Therefore coding techniques are applied to the side-information too. A description of the lossless encoding of DSD signals is given in the publication 'Improved lossless coding of 1-bit audio signals', by F. Bruekers et al, preprint 4563(I-6) presented at the 103$^{rd}$ convention of the AES, Sep. 26–29, 1997 in New York.

The invention aims at providing methods that can be used e.g. in SACD to save on the number of bits that have to be used for storing the side-information. In the following description those methods will be presented.

Figure 1A:
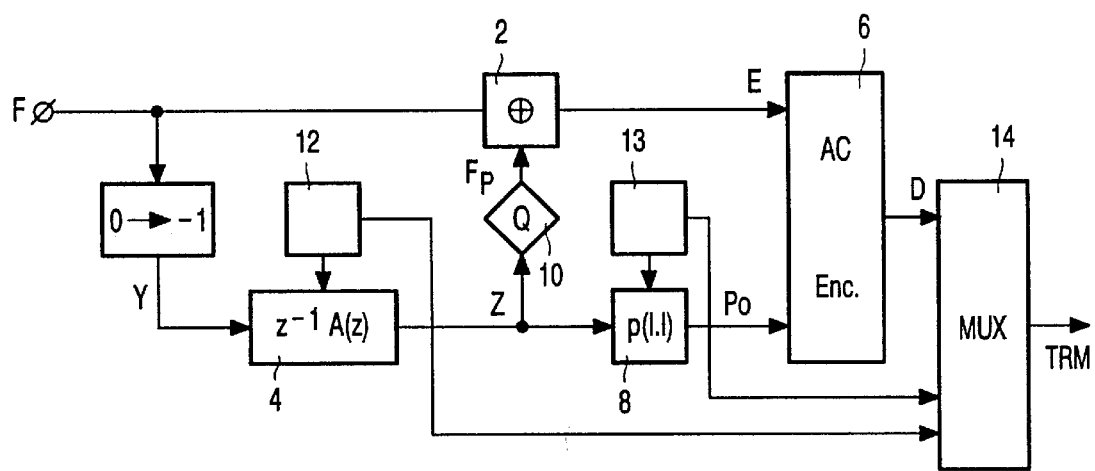
Figure 1B:
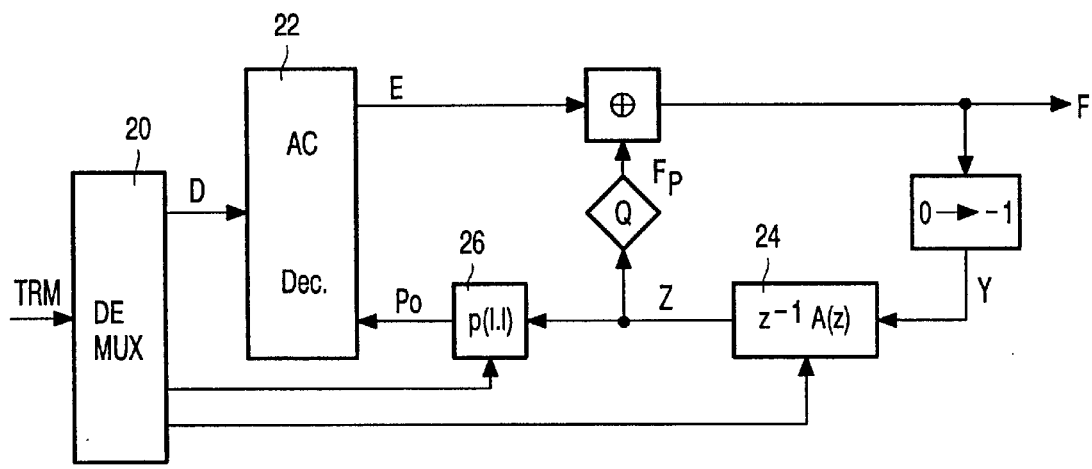
Figure 2:
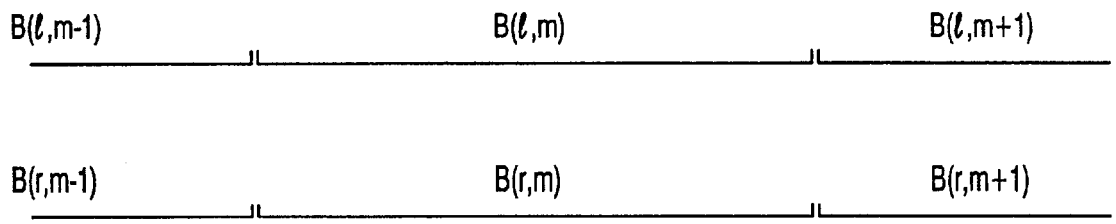
Figure 3:
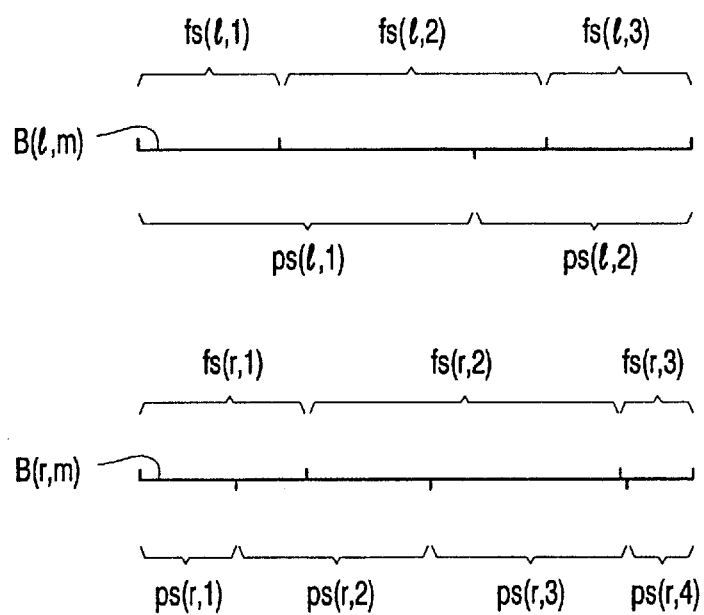
Figure 4:
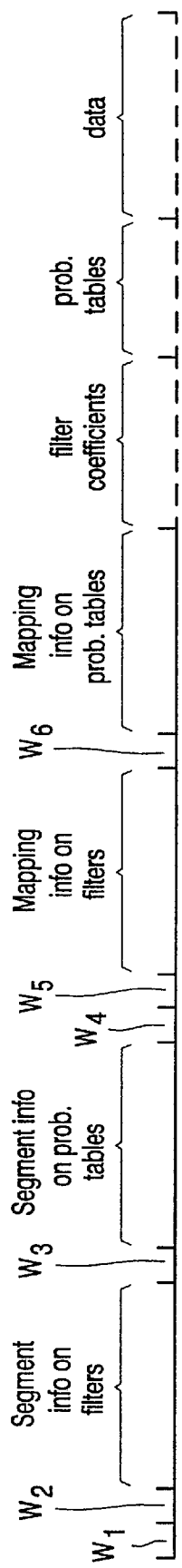

These and other aspects of the invention will be further explained hereafter in the figure description, in which FIG. 1a shows a circuit diagram of a lossless encoder and FIG. 1b shows a circuit diagram of a corresponding decoder, using linear prediction and arithmetic coding, FIG. 2 shows subsequent frames of a multi channel information signal, FIG. 3 shows the segmentation of time equivalent frames of the multi channel information signal, and FIG. 4 shows the contents of a frame of the output signal of the encoding apparatus.

The process of lossless encoding and decoding, for the example of 1-bit oversampled audio signals, will be explained briefly hereafter by means of FIG. 1, which shows an embodiment of the encoder apparatus in FIG. 1a and shows an embodiment of the decoder apparatus in FIG. 1b.

The lossless coding in the apparatus of FIG. 1a is performed on isolated parts (frames) of the audio signal. A typical length of such a frame is 37632 bits. The two possible bit-values of the input signal F, '1' and '0', represent the sample values +1 and −1 respectively. Per frame, the set of coefficients for the prediction filter $z^{-1}.A(z)$, denoted by 4, is determined in a filter coefficient generator unit 12, by e.g. the autocorrelation method. The sign of the filter output signal, Z, determines the value of the predicted bit $F_p$, whereas the magnitude of the filter output signal, Z, is an indication for the probability that the prediction is correct. Upon quantizing the filter output signal Z in a quantizer 10, a predicted input signal $F_p$ is obtained, which is ex-ored in a combining unit 2, resulting in a residual signal E. A correct prediction, or $F=F_p$, is equivalent to $E=0$ in the residual signal E. The content of the probability table, $p(.|.)$, is designed per frame such that per possible value of Z, $p_0$ is the probability that $E=0$. For small values of $|Z|$ the probability for a correct prediction is close to 0.5 and for large values of $|Z|$ the probability for a correct prediction is close to 1.0. Clearly the probability for an incorrect prediction, $F \neq F_p$ or $E=1$, is $p_1=1-p_0$.

The probability tables for the frames (or segments, to be described later) are determined by the unit 13. Using this probability table, supplied by the unit 13 to the unit 8, the unit 8 generates a probability value $P_0$ in response to its input signal, which is the signal Z.

The arithmetic encoder (AC Enc.) in the apparatus of FIG. 1a, denoted by 6, codes the sequence of bits of E such that the code (D) requires less bits. For this, the arithmetic coder uses the probability that bit n of signal E, E[n], has a particular value. The number of bits to code the bit E[n]=0 is:

$$d_n=-^2\log(p_0)+\epsilon \text{(bits)} \qquad \text{(Eq. 1)}$$

which is practically not more than 1 bit, since $p_0 \geq \frac{1}{2}$. The number of bits to code the bit E[n]=1 is:

$$d_n=-^2\log(p_1)+\epsilon=-^2\log(1-p_0)+\epsilon \text{(bits)} \qquad \text{(Eq. 2)}$$

which is not less than 1 bit. The $\epsilon$ in both equations represents the non-optimal behavior of the arithmetic coder, but can be neglected in practice.

A correct prediction (E[n]=0) results in less than 1 bit and an incorrect prediction (E[n]=1) results in more than 1 bit in the code (D). The probability table is designed such that on the average for the complete frame, the number of bits for code D is minimal.

Besides code D, also the coefficients of the prediction filter 4, generated by the coefficient generator unit 12, and the content of the probability table, generated by the probability table determining unit 13, have to be transmitted from encoder to decoder. To that purpose, the encoder apparatus comprises a multiplexer unit 14, which receives the output signal of the coder 6, as well as side information from the generator units 12 and 13. This side information comprises the prediction filter coefficients and the probability table. The multiplexer unit 14 supplies the serial datastream of information to a transmission medium, such as a record carrier.

In the decoder apparatus of FIG. 1b, exactly the inverse of the encoder process is implemented thus creating a lossless coding system. The demultiplexer unit 20 receives the serial datastream comprising the data D and the side information. It retrieves the data D therefrom and supplies the data D to an arithmetic decoder 22. The arithmetic decoder (AC Dec.) is provided with the identical probabilities as the arithmetic encoder was, to retrieve the correct values of signal E. Therefore the demultiplexer unit retrieves the same prediction filter coefficients and probability table as used the encoder from the serial datastream received and supplies the prediction filter coefficients to the prediction filter 24 and the probability table to the probability value generator unit 26.

The circuit constructions shown in FIG. 1 are meant for encoding/decoding a single serial datastream of information. Encoding/decoding a multi channel information signal, such as a multi channel digital audio signal, requires the processing described above with reference to FIG. 1 to be carried out in time multiplex by the circuits of FIG. 1, or can be carried out in parallel by a plurality of such circuits. Another solution can be found in international patent application IB 99/00313, which corresponds to U.S. Ser. No. 09/268252 (PHN 16.805).

It should be noted here that in accordance with the invention, the encoding apparatus may be devoid of the quantizer Q and the combining unit 2. Reference is made to earlier patent publications discussing this.

In SACD the 1-bit audio channels are chopped into frames of constant length and per frame the optimal strategy for coding will be used. Frames can be decoded independently from neighbouring frames. Therefore we can discuss the data structure within a single frame.

FIG. 2 shows time equivalent frames B of two channel signals, such as the left and right hand signal component of a digital stereo audio signal, indicated by . . . , B(l, m−1), B(l, m), B(l, m+1), . . . for the left hand signal component and by . . . , B(r, m−1), B(r, m), B(r, m+1), . . . for the right hand signal component. The frames can be segmented, as will be explained hereafter. If not segmented, the frames will be encoded in their entirety, with one set of filter coefficients and one probability table for the complete frame. If segmented, each segment in a frame can have its own set of filter coefficients and probability table. Furthermore, the segmentation in a frame for the filtercoefficients need not be the same as for the probability tables. As an example, FIG. 3 shows the two time equivalent frames B(l, m) and B(r, m) of the two channel signals being segmented. The frame B(l, m) has been segmented into three segments fs(l, 1), fs(l, 2) and fs(l, 3) in order to carry out three different prediction filterings in the frame. It should however be noted that the filterings in two segments, such as the segments fs(l, 1) and fs(l, 3) can be the same. The frame B(l, m) has further been segmented into two segments ps(l, 1) and ps(l, 2) in order to have two different probability tables for those segments.

The frame B(r, m) has been segmented into three segments fs(r, 1), fs(r, 2) and fs(r, 3) in order to carry out three different prediction filterings in the frame. It should however again be noted that the filterings in two segments, such as the segments fs(r, 1) and fs(r, 3) can be the same. The frame B(r, m) has further been segmented into four segments ps(r, 1), ps(r, 2), ps(r, 3) and ps(r, 4) in order to have four different probability tables for those segments. Again, it should be noted that some of the segments can have the same probability table.

The decision to have the same probability table for different segments can be taken on beforehand by a user of the apparatus, after having carried out a signal analysis on the signals in the segments. Or the apparatus may be capable of carrying out this signal analysis and decide in response thereto. In some situations, a signal analysis carried out on two segments may result in probability tables that differ only slightly. In such situation, it can be decided to have one and the same probability table for both segments. This one probability table could be equal to one of the two probability tables established for the two segments, or could be an averaged version of both tables. An equivalent reasoning is valid for the sets of filter coefficients in the various segments. To summarize: in order to encode a small portion of audio in an audio channel signal, the coding algorithm in SACD requires both a prediction filter (the filter) and a probability table (the table). For improving the coding gain it can be efficient to use different filters in different channels. But also within the same channel is can be beneficial to use different filters. That is why the concept of segmentation is introduced. A channel is partitioned into segments and in a segment a particular filter is used. Several segments, also from other channels, may use the same or a different filter. Besides storage of the filters that are used, also information about the segments (segmentation) and information about what filter is used in what segment (mapping) have to be stored.

For the tables, the same idea is applicable, however the segmentation and mapping may be different from the segmentation and mapping for the filters. In case of equal segmentation for both filter and table this is indicated. The same idea is used for the mapping. If the segmentation for the filters is equal for all channels this is indicate too. The same idea is used for the mapping.

First, a description will be given of the contents of a frame of a transmission signal comprising the encoded channel signals and the corresponding side information. FIG. 4 shows a schematic drawing of the frame. Apart from synchronization information (not shown), the frame comprises two words $w_1$ and $w_2$, followed by segmentation information on the prediction filters. Next a word $w_3$ is present followed by segmentation information on the probability tables. Next follow two words $w_4$ and $w_5$, followed by mapping information on the prediction filters. Next, follows a word $w_6$, followed by mapping information on the probability tables. Next follow the filter coefficients and the probability tables, as supplied by the generator units 12 and 13, respectively. The frame ends with the data D, supplied by the arithmetic encoder 6.

The word $w_1$ is in this example one bit long and can have the value '0' or '1', and indicates whether the segment information for the filter coefficients and the probability tables are the same ('1'), or not ('0'). The word $w_4$ is in this example one bit long and can have the value '0' or '1', and indicates whether the mapping information for the filter coefficients and the probability tables are the same ('1'), or not ('0'). The word $w_2$, again one bit long, can have the value '0' or '1', and indicates whether the channel signals have the same segmentation information for the prediction filter coefficients ('1'), or not ('0'). The word $w_3$ (one bit long) can have the value '0' or '1', and indicates whether the channel signals have the same segmentation information for the probability tables ('1'), or not ('0'). The word $w_5$ can have the value '0' or '1', and indicates whether the channel signals have the same mapping information for the prediction filter coefficients ('1'), or not ('0'). The word $w_6$ can have the value '0' or '1', and indicates whether the channel signals have the same mapping information for the probability tables ('1'), or not ('0').

First, the representation of the total number of segments S in a frame will be described.

To code a number, e.g. the total number of segments in a frame in a particular channel signal, a kind of run-length coding is applied. It is important that the code is short for small values of S. Since the number of segments in a channel $S \geq 1$, S=0 needs not to be coded. In SACD the following codes are used.

TABLE 1

| S | code(S) |
|---|---------|
| 1 | 1 |
| 2 | 01 |
| 3 | 001 |
| 4 | 0001 |
| s | $0^{(s-1)}1$ |

Remark: Here the "1" is used as delimiter. It is clear that in general the role of the "0" and "1" can be interchanged. The basic idea of the delimiter is that a certain sequence is violated; the sequence of "0's" is violated by a "1". An alternative is e.g. to "inverse" the next symbol and "no inversion" is used as a delimiter. In this way long constant sequences are avoided. An example of inverting sequences that start with an "1" is (not used in SACD):

| S | code(S) |
|---|---------|
| 1 | 0 |
| 2 | 11 |
| 3 | 100 |
| 4 | 1011 |

-continued

| S | code(S) |
|---|---------|
| 5 | 10100   |
| 6 | 101011  |

Second, the representation of the segment sizes will be described. The length of a segment will be expressed in number of bytes of the channel signal. The B bytes in a frame of a channel signal are partitioned into S segments. For the first S−1 segments the number of bytes of each segment has to be specified. For the $S^{th}$ segment the number of bytes is specified implicitly, it is the remaining number of bytes in the channel. The number of bytes in segment i, equals
$B_i$ so the number of bytes in the last segment is:

$$B_{S-1} = B - \sum_{i=0}^{s-2} B_i$$

Since the number of bytes in the first S−1 segments are multiples of R, the resolution R≧1, we define:
$B_i = b_i R$ and consequently:

$$B_{S-1} = B - \sum_{i=0}^{s-2} b_i R$$

The S−1 values of $b_i$ are stored and R is stored in a channel only if S>1 and when it is not stored already for another channel.

The number of bits required to store $b_i$ depends on its possible values.
$0 \leq b_i \leq b_{i,max}$ with e.g.

$$b_{i,max} = \left\lfloor \frac{B}{R} \right\rfloor - \sum_{j=0}^{i-1} b_j$$

so the required number of bits to store $b_i$ is:

$\#bits(b_i) = \lfloor^2 \log(b_{i,max}) \rfloor + 1$

This has as advantage that the required number of bits for the segment length may decrease for segments at the end of the frame. If restrictions are imposed on e.g. minimal length of a segment the calculation of the number of bits may be adapted accordingly. The number of bits to store the resolution R is: #bits(R)

Third, the representation of the segmentation information in the serial datastream will be described. Use will be made of the representations given above under table 1. This will be illustrated by some examples.

In order to distinguish between filters and probability tables, the subscripts f and t are used. To distinguish between segments in different channels the double argument is used: (channel number, segment number).

Next follows a first example. For a 2-channel case, we have different segmentations for filters and probability tables, and the segmentation is different for both channels. The following table shows the parameters in the stream.

TABLE 2

| Value | # bits | comment |
|-------|--------|---------|
| ($w_1$ =) 0 | 1 | segmentation information for the filters is different from the segmentation for the probability tables |
|  |  | filter segmentation |
| ($w_2$ =) 0 | 1 | channels have own filter segmentation information |
|  |  | filter segmentation in channel 0 |
| ($y_1$ =) 0 | 1 | first bit of code($S_f$(0)) indicating that $S_f(0) \geq 2$ |
| $R_f$ | # bits($R_f$) | resolution for filters |
| $b_f$(0,0) | # bits($b_f$(0,0)) | first segment in channel 0 has length $R_f b_f$(0,0) bytes |
| ($y_2$ =) 1 | 1 | last bit of code($S_f$(0)) indicating that $S_f$(0) = 2 |
|  |  | filter segmentation in channel 1 |
| ($y_1$ =) 0 | 1 | first bit of code($S_f$(1)) indicating that $S_f(1) \geq 2$ |
| $b_f$(1,0) | # bits($b_f$(1,0)) | first segment in channel 1 has length $R_f b_f$(1,0) bytes |
| ($y_2$ =) 0 | 1 | second bit of code($S_f$(1)) indicating that $S_f(1) \geq 3$ |
| $b_f$(1,1) | # bits($b_f$(1,1)) | second segment in channel 1 has length $Rfb_f$(1,1) bytes |
| ($y_3$ =) 1 | 1 | last bit of code($S_f$(1)) indicating that $S_f$(1) = 3 |
|  |  | probability table segmentation |
| ($w_3$ =) 0 | 1 | channels have own table segmentation specification |
|  |  | probability table segmentation in channel 0 |
| ($y_1$ =) 1 | 1 | last bit of code($S_t$(0)) indicating that $S_t$(0) = 1 |
|  |  | probability table segmentation in channel 1 |
| ($y_1$ =) 0 | 1 | first bit of code($S_t$(1)) indicating that $S_t(1) \geq 2$ |
| $R_t$ | # bits($R_t$) | resolution for tables |
| $b_t$(1,0) | # bits($b_t$(1,0)) | first segment in channel 1 has length $R_t b_t$(1,0) bytes |
| ($y_2$ =) 0 | 1 | second bit of code($S_t$(1)) indicating that $S_t(1) \geq 3$ |
| $b_t$(1,1) | # bits($b_t$(1,1)) | second segment in channel 1 has length $R_t b_t$(1,1) bytes |
| ($y_3$ =) 1 | 1 | last bit of code($S_t$(1)) indicating that $S_t$(1) = 3 |

In the above table 2, the first combination ($y_1,y_2$) equal to (0, 1) is the codeword code(S) in table 1 above, and indicates that in the channel signal numbered 0 the frame is divided into two segments for the purpose of prediction filtering. Further, the combination ($y_1,y_2,y_3$) equal to (0, 0, 1) is the codeword code(S) in table 1 above, and indicates that in the channel signal numbered 1 the frame is divided into three segments for the purpose of prediction filtering. Next, we find a combination ($y_1$) equal to (1), which is the first codeword in table 1, indicating that the channel signal numbered 0, the frame is not divided for the probability table. Finally, we find a combination ($y_1,y_2,y_3$) equal to (0, 0, 1), which indicates that the frame of the second channel signal is divided into three segments, each with a corresponding probability table.

Next, follows another example for a 5-channel case. It is assumed that for this 5-channel case, we have equal segmentation for filters and tables, and the segmentation is equal for all channels.

| Value | # bits | comment |
|-------|--------|---------|
| ($w_1$ =) 1 | 1 | the segmentation information for the prediction filters and probability tables is the same |
|  |  | filter segmentation |
| ($w_2$ =) 1 | 1 | channels have equal filter segmentation information |
|  |  | filter segmentation in channel 0 |
| ($y_1$ =) 0 | 1 | first bit of code($S_f$(0)) indicating that $S_f(0) \geq 2$ |

-continued

| Value | # bits | comment |
|---|---|---|
| $R_f$ | # bits($R_f$) | resolution for filters |
| $b_f(0,0)$ | # bits($b_f(0,0)$) | first segment in channel 0 has length $R_f b_f(0,0)$ bytes |
| ($y_2 =$) 0 | 1 | second bit of code($S_f(0)$) indicating that $S_f(0) \geq 3$ |
| $b_f(0,1)$ | # bits($b_f(0,1)$) | second segment in channel 0 has length $R_f b_f(0,1)$ bytes |
| ($y_3 =$) 1 | 1 | last bit of code($S_f(0)$) indicating that $S_f(0) = 3$ filter segmentation in channel c $b_f(c,0) = b_f(0,0)$ and $b_f(c,1) = b_f(0,1)$ for $1 \leq c < 5$ probability table segmentation in channel c $b_t(c,0) = b_f(0,0)$ and $b_t(c,1) = b_f(0,1)$ for $0 \leq c < 5$ |

Remark: The single bits of code(S) interleaved in de segmentation information can be interpreted as "another segment will be specified" in case of "0" or "no more segments will be specified" in case of "1".

Next, mapping will be described.

For each of the segments, all segments of all channels are considered together, it has to be specified which filter or table is used. The segments are ordered; first the segments of channel 0 followed by the segments of channel 1 and so on. The filter or table number for segment s, N(s) is defined as:

$$\begin{cases} N(0) = 0 \\ 0 \leq N(s) \leq N_{max}(s) \end{cases}$$

with $N_{max}(s)$, the maximum allowed number for a given segment, defined as:

$$N_{max}(s) = 1 + \max(N(i)) \text{ with } 0 \leq i < s$$

The required number of bits to store N(s) equals:

$$\#\text{bits}(N(s)) = \lfloor {}^2\log(N_{max}(s)) \rfloor + 1$$

The number of bits that is required to store a filter or table number according to this method depends on the set of numbers that already has been assigned.

If the tables use the same mapping as the filters, which is not always possible, this is indicated. Also when all channels use the same mapping this is indicated.

With two examples the idea will be illustrated.

EXAMPLE 3

Assume that in total we have 7 segments (0 through 6), some segments use the same filter and some use a unique filter. Furthermore it is assumed that the tables use the same mapping specification as the filters.

| Channel number | Segment number | Filter number | Possible filter numbers | # bits |
|---|---|---|---|---|
| 0 | 0 | 0 | — | 0 |
| 1 | 1 | 0 | 0 or 1 | 1 |
| 1 | 2 | 1 | 0 or 1 | 1 |
| 1 | 3 | 2 | 0, 1 or 2 | 2 |
| 1 | 4 | 3 | 0, 1, 2 or 3 | 2 |

-continued

| Channel number | Segment number | Filter number | Possible filter numbers | # bits |
|---|---|---|---|---|
| 2 | 5 | 3 | 0, 1, 2, 3 or 4 | 3 |
| 3 | 6 | 1 | 0, 1, 2, 3 or 4 | 3 |
| | | | Total # bits | 12 |

Segment number 0 uses filter number 0 per definition, so no bits are needed for this specification. Segment number 1 may use an earlier assigned filter (0) or the next higher not yet assigned filter (1), so 1 bit is needed for this specification. Segment number 1 uses filter number 0 in this example. Segment number 2 may use an earlier assigned filter (0) or the next higher not yet assigned filter (1), so 1 bit is needed for this specification. Segment number 2 uses filter number 1 in this example.

Segment number 3 may use an earlier assigned filter (0 or 1) or the next higher not yet assigned filter (2), so 2 bits are needed for this specification. Segment number 3 uses filter number 2 in this example.

Segment number 4 may use an earlier assigned filter (0, 1 or 2) or the next higher not yet assigned filter (3), so 2 bits are needed for this specification. Segment number 4 uses filter number 3 in this example. Segment number 5 may use an earlier assigned filter (0, 1, 2 or 3) or the next higher not yet assigned filter (4), so 3 bits are needed for this specification. Segment number 5 uses filter number 3 in this example.

Segment number 6 may use an earlier assigned filter (0, 1, 2 or 3) or the next higher not yet assigned filter (4), so 3 bits are needed for this specification. Segment number 6 uses filter number 1 in this example.

In total 12 bits are required to store the mapping. The total number of segments (7 segments in this example) is known at this point in the stream.

| Value | # bits | comment |
|---|---|---|
| ($w_4 =$) 1 | 1 | probability tables have same mapping information as prediction filters prediction filter mapping |
| ($w_5 =$) 0 | 1 | channels have own filter segmentation information |
| | 0 | filter number for segment 0 is 0 per definition |
| $N_f(1)$ | # bits($N_f(1)$) | filter number for segment 1 |
| $N_f(2)$ | # bits($N_f(2)$) | filter number for segment 2 |
| $N_f(3)$ | # bits($N_f(3)$) | filter number for segment 3 |
| $N_f(4)$ | # bits($N_f(4)$) | filter number for segment 4 |
| $N_f(5)$ | # bits($N_f(5)$) | filter number for segment 5 |
| $N_f(6)$ | # bits($N_f(6)$) | filter number for segment 6 probability table mapping $N_t(i) = N_f(i)$ for $0 \leq i < 7$ |

Another example. Assume that in total we have 6 channels each with 1 segment and each segment uses the same prediction filter and the same probability table.

| Value | # bits | comment |
|---|---|---|
| ($w_4 =$) 1 | 1 | probability tables have same mapping information as prediction filters prediction filter mapping |

-continued

| Value | # bits | comment |
|---|---|---|
| ($w_5 =$) 1 | 1 | channels have own filter mapping specification |
| | 0 | filter number for segment 0 is 0 per definition prediction filter mapping for segment i $N_f(i) = 0$ for $1 \leq i < 6$ probability table mapping for segment i $N_t(i) = N_f(i)$ for $0 \leq i < 6$ |

In total 2 bits are required to store the complete mapping.

Remark: A reason to give the indication that a following specification is also used for other application (e.g. for tables the same segmentation is used as for the filters) is that this simplifies the decoder.

Whilst the invention has been described with reference to preferred embodiments thereof, it is to be understood that these are not limitative examples. Thus, various modifications may become apparent to those skilled in the art without departing from the scope of the invention as defined by the claims. As an example, the invention could also have been incorporated in an embodiment in which time equivalent signal blocks are encoded, without making use of segmentation. In such embodiment, the serial datastream obtained, like the datastream of FIG. 4, will be devoid of the segment information described there for the filters and the probability tables, as well as some of the indicator words, such as the indicator words $w_1$, $w_2$ and $w_3$. Further, the invention lies in each and every novel feature and combination of features.

What is claimed is:

1. Apparatus for encoding an n-channel digital audio signal, where n is an integer larger than 1, comprising:

input means for receiving the digital information signal, where n is an integer larger than 1;

encoding means for encoding the digital information signal into an encoded digital information signal, the encoding including encoding time equivalent signal blocks of each of the channel signals of the n-channel digital audio signal by dividing the time equivalent signal blocks into M segments, and encoding the signal portions of the channel signals in all M segments in the time equivalent signal blocks, so as to obtain an encoded signal portion for each of the signal portions in the M segments in response to probability values for each of the signal portions, where $$M = \sum_{i=0}^{i=n-1} sp_i$$

and $sp_i$ is the number of segments in the time equivalent signal block of the i-th channel signal;

probability value determining means for generating probability values for each of the M signal portions in response to a probability table for each of the M signal portions;

probability table determining means for generating the probability tables for each of the M signal portions;

converting means for converting the information about the length and locations of the M segments in the n channel signals into first segment information, and for generating first mapping information and a plurality of m probability tables, where m is an integer for which holds $1 \leq m \leq M$, the first mapping information and the m probability tables being representative for the M probability tables, the converting including converting information concerning the number of segments in a time equivalent signal block of a channel signal into a number code;

combining means for combining the portion of the encoded digital information signal comprised in the time equivalent signal blocks, the first segment information, the first mapping information signal, the number code and the plurality of m probability tables into a composite information signal; and output means for outputting the composite information signal.

2. The apparatus of claim 1, wherein the number code satisfies the following table:

| S | code(S) |
|---|---|
| 1 | 1 |
| 2 | 01 |
| 3 | 001 |
| 4 | 0001 |
| s | $0^{(s-1)}1$ | where S is the number of segments in a time equivalent signal block of a channel signal.

3. Apparatus for encoding an n-channel digital audio information signal, where n is an integer larger than 1, comprising:

input means for receiving the n-channel digital audio information signal, where n is an integer larger than 1;

encoding means for encoding the digital information signal into an encoded digital information signal, the encoding includes encoding each of the channel signals of the n-channel digital audio signal so as to obtain an encoded channel signal for each of the channel signals in response to probability values for each of the channel signals;

prediction filter means for carrying out a prediction filtering on each of the channel signals of the n-channel digital audio signal in response to a set of prediction filter coefficients for each of the channel signal so as to obtain a prediction filtered channel signal from each of the channel signals;

prediction filter coefficient determining means for generating a set of prediction filter coefficients for each of the channel signals;

probability value determining means for generating probability values for each of the channel signals in response to a probability table for each of the channel signals and the corresponding prediction filtered channel signal for each of the channel signals;

probability table determining means for generating the probability tables for each of the channel signals;

converting means for generating first mapping information and a plurality of m sets of prediction filter coefficients, where m is an integer for which holds $1 \pounds m \pounds n$, the first mapping information and m sets of prediction filter coefficients being representative of the n sets of prediction filter coefficients for the n channels, and for generating second mapping information and a plurality of p probability tables, where p is an integer for which holds $1 \pounds p \pounds n$, the second mapping information and p probability tables being representative of the n probability tables for the n channels;

combining means for combining the compressed digital information signal, the first and second mapping information signals, the plurality of m sets of prediction filter coefficients and the plurality of p probability tables into a composite information signal; and writing means for writing the composite information signal on a record carrier.

4. The apparatus of claim 3, in which the writing means include channel encoding and/or error correction encoding means for carrying out a channel encoding step and/or an error correction encoding step on the composite information signal prior to writing the composite information signal on the record carrier.

5. Apparatus for encoding an n-channel digital audio information signal, where n is an integer larger than 1, comprising:

input means for receiving the n-channel digital audio information signal, where n is an integer larger than 1;

encoding means for encoding the digital information signal into an encoded digital information signal, the encoding including encoding time equivalent signal blocks of each of the channel signals of the n-channel digital audio signal by dividing the time equivalent signal blocks into M segments, and encoding the signal portions of the channel signals in all M segments in the time equivalent signal blocks, so as to obtain an encoded signal portion for each of the signal portions in the M segments in response to probability values for each of the signal portions, where $$M = \sum_{i=0}^{i=n-1} sp_i$$

and $sp_i$ is the number of segments in the time equivalent signal block of the i-th channel signal;

probability value determining means for generating probability values for each of the M signal portions in response to a probability table for each of the M signal portions;

probability table determining means for generating the probability tables for each of the M signal portions;

converting means for converting the information about the length and locations of the M segments in the n channel signals into first segment information, and for generating first mapping information and a plurality of m probability tables, where m is an integer for which holds $1 \leq m \leq M$, the first mapping information and the m probability tables being representative for the M probability tables;

combining means for combining the portion of the encoded digital information signal comprised in the time equivalent signal blocks, the first segment information, the first mapping information signal and the plurality of m probability tables into a composite information signal; and writing means for writing the composite information signal on a record carrier.

6. The apparatus of claim 5, in which the writing means include channel encoding and/or error correction encoding means for carrying out a channel encoding step and/or an error correction encoding step on the composite information signal prior to writing the composite information signal on the record carrier.

7. Apparatus for decoding an encoded composite information signal, the apparatus comprising:

input means for receiving a composite information signal;

retrieval means for retrieving from the composite information signal, encoded data of an n-channel digital audio signal, where n is an integer larger than 1, and side information having a relationship with the encoded digital information signal;

decoding means for decoding the encoded data information into M signal portions in response to corresponding sets of probability values, one for each of the M signal portions, where $$M = \sum_{i=0}^{i=n-1} sp_i$$

and $sp_i$ is the number of segments in the time equivalent signal block of the i-th channel signal;

probability value generator means for generating M sets of probability values, one for each of the M signal portions in response to a corresponding probability table, the M probability tables, one for each of the signal portions, being derived from the side information;

wherein the retrieving includes retrieving first segment information and first mapping information and a plurality of m probability tables from the side information, where m is an integer for which holds $1 \leq m \leq M$;

reconverting means for reconverting the first mapping information and m probability tables into M probability tables, one for each of the signal portions, and for reconverting the first segment information into information about the length and locations of the M segments in the n channel signals so as to obtain time equivalent signal blocks in the n channel signals; and output means for outputting the time equivalent signal blocks of the n channel signals; and wherein the retrieving includes converting information to retrieve a number code for a time equivalent signal block from the side information, the number code representing the number of segments in the time equivalent signal block.

8. The apparatus of claim 7, wherein the number code satisfies the following table:

| S | code(S) |
|---|---------|
| 1 | 1 |
| 2 | 01 |
| 3 | 001 |
| 4 | 0001 |
| s | $0^{(s-1)}1$ | where S is the number of segments in a time equivalent signal block of a channel signal.

9. Apparatus for decoding an encoded composite information signal comprising, the apparatus comprising input means for receiving a composite information signal;

retrieval means for retrieving from the composite information signal, encoded data of an n-channel digital audio information signal, where n is an integer larger than 1, and side information having a relationship with the encoded digital information signal, from the composite information signal;

decoding means for decoding the encoded data information so as to obtain the n channel signals in response to a set of probability values for each of the channel signals;

prediction filter means for carrying out a prediction filtering on each of the channel signals of the n-channel digital audio signal in response to n sets of prediction filter coefficients, one set for each of the channel signals, so as to obtain a prediction filtered channel signal from each of the channel signals, the sets of prediction filter coefficients being derived from the side information;

probability value generator means for generating n sets of probability values, one for each of the channel signals in response to a corresponding prediction filtered channel signal and corresponding probability table, the n probability tables, one for each of the channel signals, being derived from the side information;

the retrieving includes retrieving first and second mapping information, a plurality of m sets of prediction filter coefficients and a plurality of p probability tables from the side information;

reconverting means for reconverting the first mapping information and the m sets of prediction filter coefficients into n sets of prediction filter coefficients, one set for each of the channel signals, where m is an integer for which holds $1 \leq m \leq n$ and for reconverting the second mapping information and the p probability tables into n probability tables, one set for each of the channel signals, where p is an integer for which holds $1 \leq p \leq n$; and output means for outputting the n channel signals; and wherein the input means includes reading means for reading the composite information signal from a record carrier.

10. The apparatus of claim 9, in which the input means further comprises channel decoding and/or error correction means for carrying out a channel decoding step and/or an error correction step on the composite information signal prior to supplying the composite information signal to the retrieval means.

11. Apparatus for decoding an encoded composite information signal, the apparatus comprising:

input means for receiving a composite information signal;

retrieval means for retrieving from the composite information signal, encoded data of an n-channel digital audio signal, where n is an integer larger than 1, and side information having a relationship with the encoded digital information signal;

decoding means for decoding the encoded data information into M signal portions in response to corresponding sets of probability values, one for each of the M signal portions, where $$M = \sum_{i=0}^{i=n-1} sp_i$$

and $sp_i$ is the number of segments in the time equivalent signal block of the i-th channel signal;

probability value generator means for generating M sets of probability values, one for each of the M signal portions in response to a corresponding probability table, the M probability tables, one for each of the signal portions, being derived from the side information;

the retrieving includes retrieving first segment information and first mapping information and a plurality of m probability tables from the side information, where m is an integer for which holds $1 \leq m \leq M$;

reconverting means for reconverting the first mapping information and m probability tables into M probability tables, one for each of the signal portions, and for reconverting the first segment information into information about the length and locations of the M segments in the n channel signals so as to obtain time equivalent signal blocks in the n channel signals; and output means for outputting the time equivalent signal blocks of the n channel signals; and wherein the input means includes reading means for reading the composite information signal from a record carrier.

12. The apparatus of claim 11, in which the input means further comprises channel decoding and/or error correction means for carrying out a channel decoding step and/or an error correction step on the composite information signal prior to supplying the composite information signal to the retrieval means.

* * * * *